United States Patent [19]

Lee et al.

[11] Patent Number: 4,812,419

[45] Date of Patent: Mar. 14, 1989

[54] VIA CONNECTION WITH THIN RESISTIVITY LAYER

[75] Inventors: Keunmyung Lee, Redwood City; Yoshio Nishi, Palo Alto, both of Calif.

[73] Assignee: Hewlett-Packard Company, Palo Alto, Calif.

[21] Appl. No.: 45,002

[22] Filed: Apr. 30, 1987

[51] Int. Cl.$^4$ .......................................... H01L 11/00
[52] U.S. Cl. .................................... 437/203; 437/194; 437/200; 357/67; 427/102; 307/306; 338/195
[58] Field of Search .............. 437/192, 200, 194, 203; 338/195; 307/306; 357/67; 427/102

[56] References Cited

U.S. PATENT DOCUMENTS

| | | | |
|---|---|---|---|
| 3,851,293 | 11/1974 | Clayton | 338/195 |
| 3,913,120 | 10/1975 | Lahiri | 307/306 |
| 3,996,551 | 12/1976 | Croson | 338/195 |
| 4,019,168 | 3/1977 | Collins | 338/195 |
| 4,057,894 | 11/1977 | Khajezadeh et al. | 338/195 |
| 4,083,029 | 3/1978 | Lahiri | 307/306 |
| 4,107,726 | 8/1978 | Schilling | 357/71 |
| 4,205,297 | 5/1980 | Johnson et al. | 338/195 |
| 4,217,570 | 8/1980 | Holmes | 338/195 |
| 4,288,776 | 9/1981 | Holmes | 338/195 |
| 4,298,856 | 11/1981 | Schuchardt | 338/195 |
| 4,406,051 | 9/1933 | Iizuka | 29/576 B |
| 4,410,622 | 10/1983 | Dalal et al. | 156/664 |
| 4,454,495 | 6/1984 | Werner et al. | 338/195 |
| 4,477,310 | 10/1984 | Park et al. | 156/643 |
| 4,609,903 | 9/1986 | Toyokura et al. | 338/22 SD |

FOREIGN PATENT DOCUMENTS 0122659 10/1984 European Pat. Off. .
5850770 3/1983 Japan .
1488728 6/1974 United Kingdom .

OTHER PUBLICATIONS

Gardner, Donald and Krishna Saraswat, "Layered and Homogeneous Films of Aluminum and Aluminum/Silicon with Titanium and Tungsten for Multilevel Interconnects", IEEE Transactions on Electron Devices, vol. ED-32, No. 2, Feb. 1985, pp. 174–183.

J. M. Pimbley et al., "Current Crowding in High-Density VLSI Metallization Structures", IEEE Transactions on Electron Devices, vol. ED-33, No. 9, Sept. 1966, pp. 1399–1401.

Primary Examiner—Brian E. Hearn
Assistant Examiner—Beverly A. Pawlikowski
Attorney, Agent, or Firm—William H. F. Howard; Edward Y. Wong

[57] ABSTRACT

A via connection and method for making the same for integrated circuits having multiple layers of electrically conductive interconnect lines separated by an insulative layer. The via connection is characterized by a very thin layer of high resistivity material lining the via hole in conductive contact with interconnect lines in two layers. The resistivity of the thin layer material is in a range from about 10 to about 50 times the interconnect line resistivities and generally has a thickness of less than 100 nanometers. The thin layer assures more uniform current flow in the via connection thereby preventing electromigration, with reduced peak local current density by causing current to swing more widely around the corner at the interface between the interconnect lines at the via.

12 Claims, 4 Drawing Sheets

VIA CONNECTION WITH THIN RESISTIVITY LAYER

DESCRIPTION

1. Technical Field

The present invention relates to via connections in integrated circuits and to methods of forming via connections, and in particular to such methods and via connections for reducing electromigration of atoms of interconnect lines.

2. Background Art

Continuing development of integrated circuits is directed principally toward increasing the layout density of circuit elements without sacrificing manufacturability, desired electrical properties, and reliability. As dimensions shrink, the current density flowing through interconnect lines increases. Electromigration of atoms of interconnect lines, which in time leads to circuit failure, is more severe where current density is high. Thus, as dimensions shrink, electromigration lifetimes, i.e. the mean time to circuit failure due to electromigration, decrease due to increasing current densities. Electromigration is an especially important problem for the submicrometer line widths found in integrated circuits of VLSI technology.

Integrated circuits using multilevel metallization schemes are characterized by a plurality of levels of electrically conductive interconnect lines separated by layers of insulative material. Via connections, often simply referred to as "vias", connect interconnect lines on one level with those on another level. Thus, in a two-level metal structure, a first level of electrically conductive lines connect to individual circuit elements on a semiconductor chip and vias formed through an insulative layer connect at least some of these lines with other electrically conductive lines on a second level overlying the insulative layer.

Current crowding at via connections is a major reliability problem in integrated circuits since it enhances electromigration. Current crowding is the non-uniform flow of current which occurs at the interface between an interconnect line and a via connection. The local current density at some locations of the interface may be higher than the average current density in the interconnect lines. Electromigration is most severe in these high local current density regions. Previously, low mobility "barrier" metals have been used at via connections to reduce electromigration. However, this approach does not change the current flow pattern. Keeping via connections large reduces current density, but limits the circuit density and degree of device integration that can be achieved.

In an article in IEEE Transactions on Electron Devices, vol. ED-33, No. 9, September, 1986, pp. 1399–1401, J. M. Pimbley and D. M. Brown describe a metallization structure having a first metal layer, an insulating layer with a via hole etched therein, a metal plug formed in the via hole, and a second metal layer. The metal plug contacts both metal layers so as to electrically connect the metal layers. The article then shows that the peak current density is reduced when the metal layers are aluminum having a low resistivity, i.e. about 2.5 $\mu\Omega$-cm, and the plug is tungsten having a higher resistivity, i.e. about 8 $\mu\Omega$-cm. Unfortunately, metal plugs are relatively difficult to form, requiring either selective deposition only at the holes or direct deposition followed by planarization. Further, as noted in the article, increasing the resistivity of the plug also increases the overall line resistance.

An object of the present invention is to produce via connections having a more uniform current flow and reduced peak current density without significantly increasing the resistance through the via, thereby reducing the possibility of electromigration circuit failure.

Another object of the present invention is to develop a simple method of making the via connections.

DISCLOSURE OF THE INVENTION

The above objects have been met with a via connection for integrated circuits having a very thin high resistivity layer in conductive contact with first and second electrically conductive interconnect lines on different levels. The increase of the total resistance due to the high resistivity layer is negligible because the peak current density can be effectively reduced with a very thin layer, generally less than 0.1 $\mu$m thick. The first and second interconnect lines are characterized by approximately equal line resistivities, generally less than 8 $\mu\Omega$-cm. The thin layer is disposed in a via hole in a layer on insulating material between the levels of interconnect lines, and is characterized by a resistivity which is in a range from about 10 to about 50 times the line resistivities of the inteconnect lines.

A method of forming such via connections begins by depositing a planar insulative layer over the surface of a wafer. A silicon oxide or nitride layer is typical. This insulative layer is then patterned to make openings for a superposed first metal layer which is deposited over the insulative layer. The metal layer is then patterned to make openings where desired. Next, another insulative layer is applied over the metal layer and again, this layer is patterned to make openings where desired. There are many openings or holes created in this insulative layer which will form the vias between a superposed second metal layer and the underlying first metal layer. Over the insulative layer, a high resistivity layer, but electrically conductive, is deposited. The layer is kept very thin, as described above. Next, the second metal layer is applied over the surface of the resistive layer and now both the resistive layer and the second metal layer are patterned, etching away undesired regions. The second metal layer will extend into the via holes, so that a conductive path now exists through the vias from the second metal level to the first with a current path necessarily extending through the thin high resistivity layer.

It has been found that this method of producing vias reduces the peak current density by more than 40 percent.

BEST MODE FOR CARRYING OUT THE INVENTION

Figure 1:
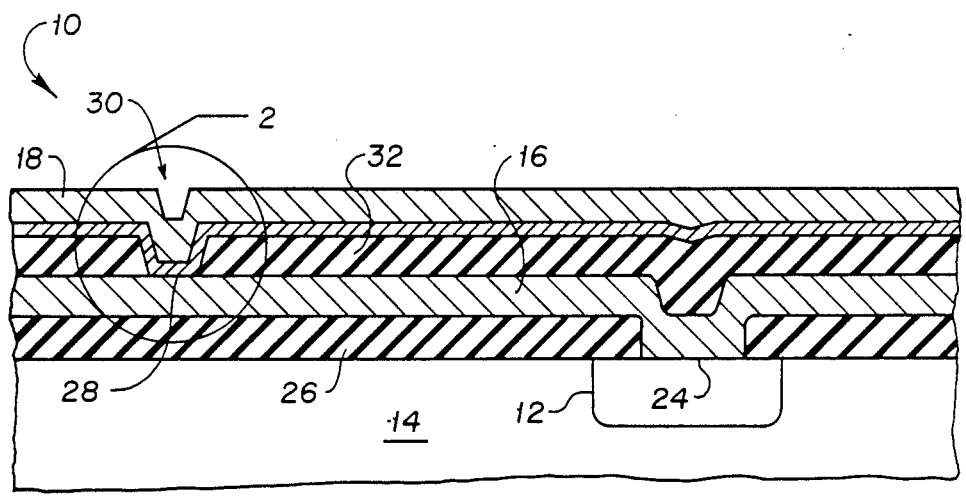
FIG. 1 is a side section through an integrated circuit having via connections made in accord with the present invention.

With reference to FIG. 1, an integrated circuit 10 comprises a plurality of circuit elements, as for example, circuit element 12, on a semiconductor chip 14. Circuit elements 12 are interconnected to form an integrated circuit 10 of specified function by means of electrically conductive interconnect lines 16 and 18 on a multitude of levels 20 and 22. Thus, for example, a first level 20 of interconnect lines 16 connects to circuit elements 12 at points 24. An insulating layer 26 separates first level 20 from semiconductor chip 14 except at connect points 24. A second level 22 of interconnect lines 18 connects to at least some of the first interconnect lines 16 at selected locations 28 thereof by means of via connections or "vias", such as via 30. An insulating layer 32 separates first and second levels 20 and 22 except at vias 30.

In integrated circuit 10, semiconductor chip 14 is typically composed of silicon and circuit element 12 may be a MOSFET for use in NMOS and CMOS circuits or a bipolar transistor. However, semiconductor chip 14 may also be composed of any other material used for integrated circuits, such as gallium arsenide, and circuit elements 12 may be any structure, including bipolar diodes and transistors, using any known circuit logic developed for integrated circuits, particularly those applicable to the submicron sizes of VLSI technology. Insulative layers 26 and 32 are typically $SiO_2$ or $Si_3N_4$, but other insulative materials may also be used.

Figure 2:
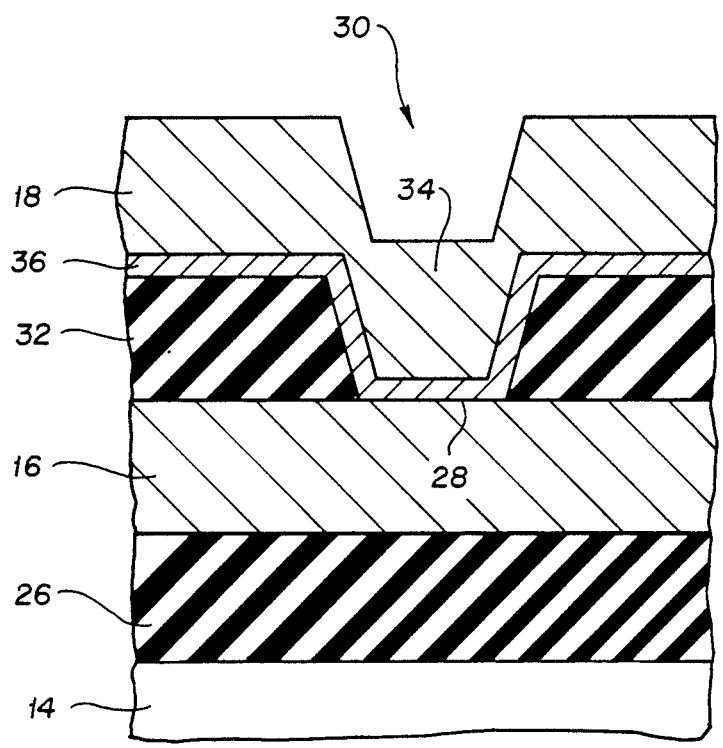
FIG. 2 is an enlarged view of the via connection inside circle 2 of FIG. 1.
Figure 3:
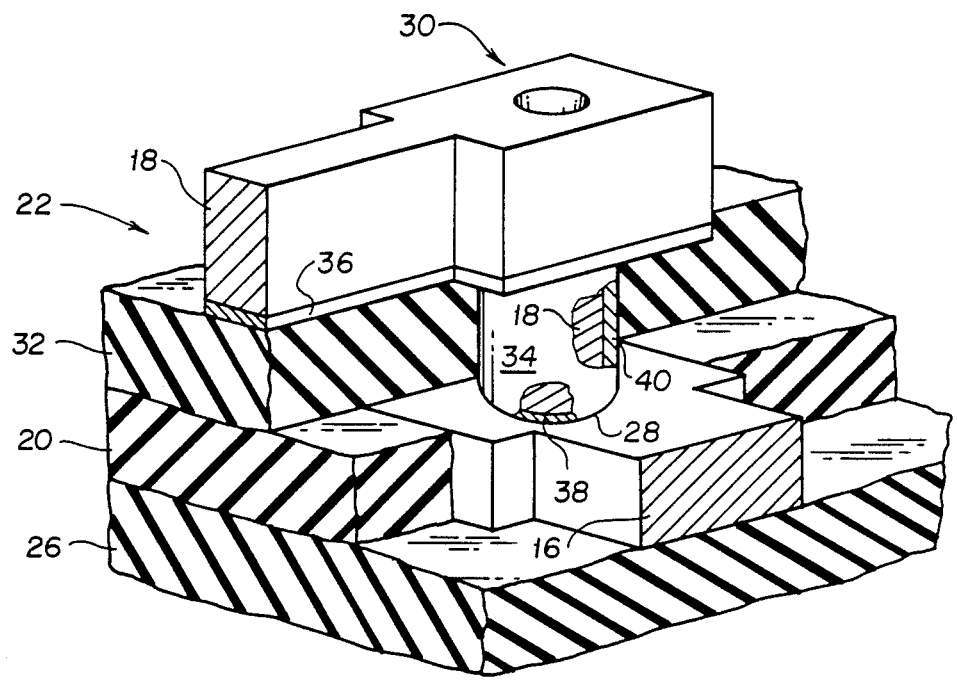
FIG. 3 is a cutaway perspective view of the via connection of FIG. 1.

Referring to the region inside circle 2 of FIG. 1, shown greatly enlarged in FIGS. 2 and 3, a via connection 30 connects a first electrically conductive interconnect line 16 on a first level 20 to a second electrically conductive interconnect line 18 on a second level 22. A layer 26 of electrically insulative material separates first level 20 with semiconductor chip 14, and another layer 22 of electrically insulative material is disposed over first level 20 so as to separate first and second levels 20 and 22 electrically.

Lines 16 and 18 are characterized by approximately equal line resistivities which depend on the composition of lines 16 and 18. Generally, the line resistivities should be less than 8 $\mu\Omega$-cm for low line resistance and preferably the line resistivities are less than 4 $\mu\Omega$-cm. Accordingly, electrically conductive lines 16 and 18 are preferably composed of metallic material selected from the group consisting of aluminum ($\rho = 2.83$) and gold ($\rho = 2.44$). First and second lines 16 and 18 preferably have a thickness and width of at most 1.0 $\mu$m, with typical dimensions being about 0.8 $\mu$m. However, where circuit layout density is not a critical factor larger dimensions may be used.

A via hole 34 is formed in insulative layer 32 over a specified position 28 of first line 16. Typically, hole 34 has a diameter of at most 1.0 m. A thin electrically conductive layer 36 is disposed in hole 34 in electrical contact with first line 16. At the least, layer 36 lines the bottom 38 of hole 34. Typically, thin layer 36 also lines the sides 40 of hole 34, and may additionally be deposited over insulative layer 32, as shown. Second electrically conductive line 18 is disposed over insulative layer 32 and extends into hole 34 into contact with thin layer 36.

Thin layer 36 is characterized by a high resistivity in a range from about 10 to about 50 times the line resistivity of lines 16 and 18, and typically is about 20 times the line resistivity. Accordingly, if silver is used as the material for lines 16 and 18, the resistivity of thin layer 36 preferably falls between 16 and 80 $\mu\Omega$-cm. For aluminum, the preferred range is about 28 $\mu\Omega$-cm to about 142 $\mu\Omega$-cm. Materials which satisfy these conditions are known in the art as electrically resistive metals or resistance metals and typically consist of lead, and alloys containing two or more of the elements nickel, chromium, iron, copper, manganese, and tungsten and/or silicides of these metals. Overly reactive metals should be avoided. The exact composition of these alloys and thus their resistivities may vary by up to 10 percent from the typical values. Thin layer 36 is deposited to a thickness of only from about 50 nm to about 100 nm so the increase in the total resistance of via 30 due to thin layer 36 is negligible.

Figure 4:
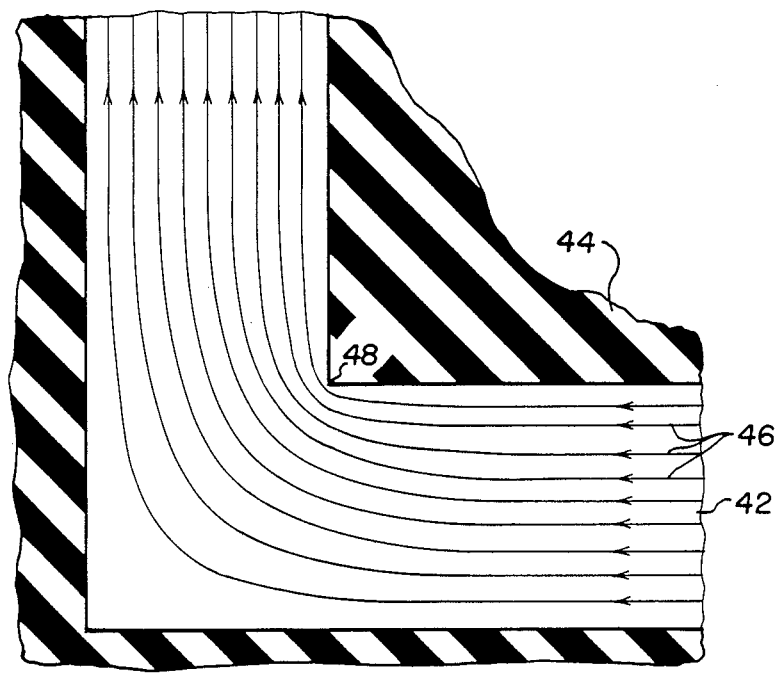
FIGS. 4 and 5 are simplified two-dimensional plan views illustrating the operation of via connections with and without a thin high resistivity layer, respectively.
Figure 5:
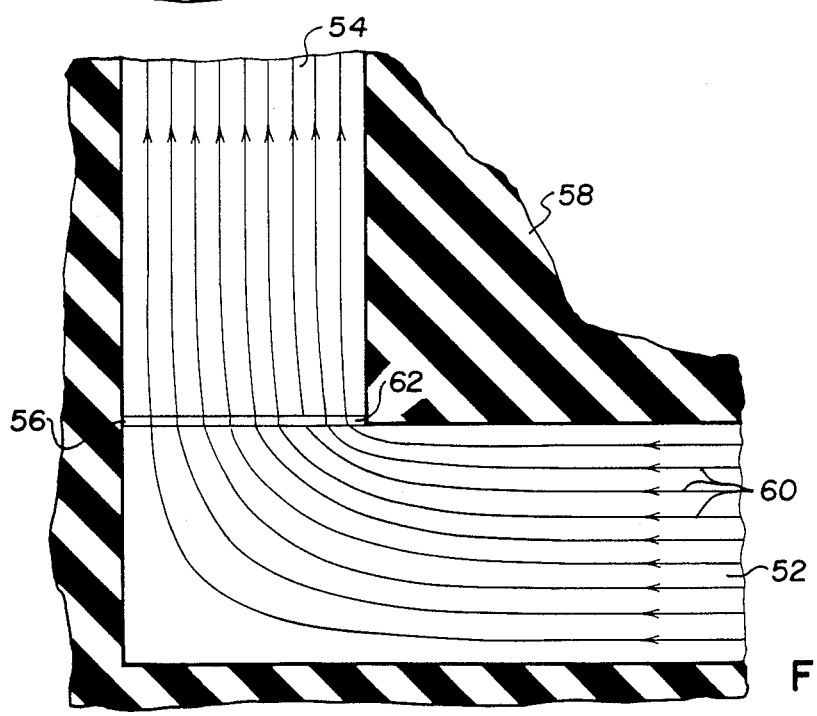

With reference to FIGS. 4 and 5, the effect of thin high resistivity layer 36 on current flow is seen with respect to a simplified two dimensional example. In FIG. 4, an L-shaped conductor 42 with uniform resistivity is surrounded by insulative material 44. Current, represented by charge carrier flux lines 46, flows non-uniformly around the corner 48. The local current density, indicated by the separation of lines 46, is greatest in the region nearest corner 48. It is experimentally known that electromigration is most severe in this high current density region.

In FIG. 5, conductors 52 and 54 with low resistivity are separated by a thin high resistivity strip 56 of conductive material. Again conductors 52, 54 and 56 are surrounded by insulative material 58. Current, represented by lines 60, flows more uniformly around corner 62, since the current turns widely as it encounters the high resistivity strip 56. The peak current density near corner 62 is thereby effectively reduced.

Although it is impractical to directly measure the local current density at a via, the current flow may be simulated by evaluating Laplace's equation $$\nabla^2 V(\vec{r}) = 0,$$

in three dimensions for electric potential, where $V(\vec{r})$ is the electrical potential. In the embodiment in FIGS. 1-3, for example, if the line resistivity of first and second lines 16 and 18 are both 4 $\mu\Omega$-cm, lines 16 and 18 have width and thickness dimensions of 0.8 $\mu$m, and thin layer 36 is 100 nm thick and has a resistivity of 80 $\mu\Omega$-cm, then the peak currrent density is $2.26 \times 10^8$ A/$cm^2$, where the current is normalized to 1 ampere. This represents a decrease of 43% over a similar embodiment without thin layer 36. The resistance of the via 30 increases from 0.243 $\Omega$ to 0.405 $\Omega$, but the increase over the entire interconnection line is negligible compared to the increase from a plug of high resistivity material.

Figure 6:
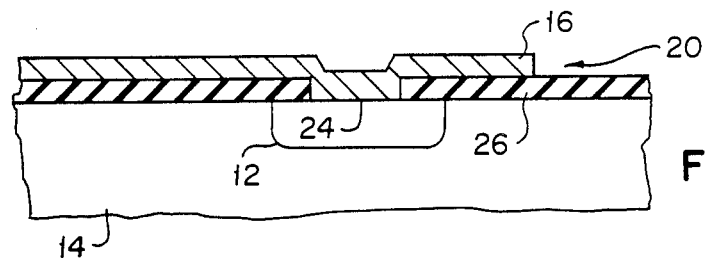
FIGS. 6–9 are side sectional views illustrating a method of the present invention for making via connections.

The process of making the via connections of the present invention is seen with reference to FIGS. 6-9. In FIG. 6, a first level 20 of electrically conductive lines 28 contacting circuit elements 12 at points 24 is formed on a semiconductor chip 14. Formation of interconnect lines 28 may be by any process known in the art. For example, an oxide or other insulating layer 26 may be formed by vacuum sputtering, heating the chip 14 in an oxygen or other environment, or other known means. A photoresist layer may be laid down over oxide insulating layer 26 and hole regions defined by exposure to ultraviolet light through a mask. The photoresist layer in the hole regions may then be removed and the oxide layer 20 etched to the chip surface at points 24. The remaining photoresist is then removed. As noted above, lines 28 are preferably composed of aluminum or gold, and preferably have a thickness and width of at most one micron.

Figure 7:
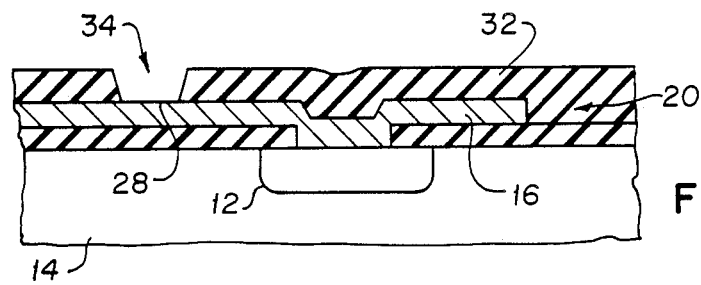

In FIG. 7, after formation of the first level 20 of electrically conducting lines 16, a layer 32 of insulation material is applied on first level 20. Insulation layer 32 may be applied by vacuum sputtering, vapor deposition or other vacuum processes. Next many holes 34, which will eventually form the via connections, are created in insulative layer 32. A way of forming holes 34 is by applying a photoresist layer to insulative layer 32, patterning hole areas in the resist by exposure to ultraviolet or other actinic radiation through a mask, removing resist in the hole areas and etching away insulative layer 32 down to lines 20 where the hole area has been removed. The remaining resist layer is removed. The resulting holes 34 typically have a diameter of at most 1.0 micron.

Figure 8:
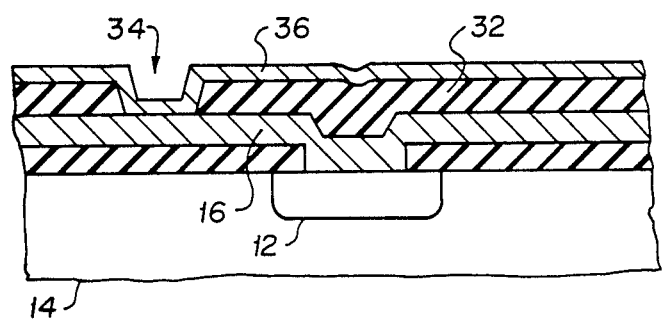

In FIG. 8, after hole formation, a thin layer 36 of high resistivity electrically conductive material is deposited in holes 34. As noted above, thin layer 36 is characterized by a high resistivity in a range from about 10 to about 50 times the resistivity of lines 16 and is typically composed of a resistance metal such as an alloy of two or more of the elements nickel, chromium, iron, copper, tungsten and manganese, and silicides of these. Thin layer 36 thus typically lines the bottom and sides of hole 34 and may also cover insulative layer 32, as shown. At a minimum, thin layer 36 must completely line the bottom of hole 34. By "thin", we mean that thin layer 36 is deposited to a thickness in a range from 50 nm to 100 nm, and thus does not completely fill hole 34 to form an undesirable high resistance plug.

Figure 9:
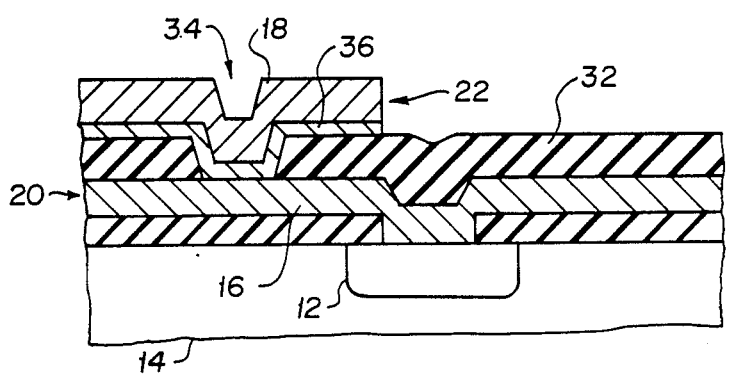

With reference to FIG. 9, after the deposition of the thin layer 36, a superposed metal layer 22 is applied completely over the thin layer 36. This layer of metal together with the thin resistive layer 36 are patterned together so that electrically conductive lines 18 are formed in a desired circuit pattern. These conductive lines extend into holes 34, maintaining contact with thin layer 36. Lines 18 typically are made of the same material as lines 16 of first level 20, but this is not absolutely necessary. As noted above, lines 18 are typically composed of aluminum or gold and have a thickness and width of preferably not more than 1.0 micron.

The resulting via connections produced by the above described method are particularly applicable to integrated circuit fabrication involving wafers using VLSI technology where the submicron device sizes and submicron wide interconnect lines are subject to high average current densities. Electromigration is reduced by assuring more uniform current flow through via connections so that the peak local current density at the vias is reduced. Accordingly, integrated circuits using these via connections have increased lifetimes.

We claim:

1. A method of forming via connections in an integrated circuit comprising,
    forming a first level of first electrically conductive lines connected to individual circuit elements on a semiconductor chip,
    applying a layer of insulative material on said first level,
    creating a plurality of holes in said layer of insulative material, said holes being formed over and exposing portions of said first electrically conductive lines,
    depositing a thin layer of electrically conductive material in said holes, said thin layer contacting said first conductive lines, said thin layer characterized by a resistivity in a range from about 10 to about 50 times a resistivity of said first conductive lines and a thinness in a range of between 50 nanometers and 100 nanometers, and
    forming a second level of second electrically conductive lines, said second lines extending into said holes into contact with said thin layer, said second lines having a resistivity which is approximately equal to said resistivity of said first lines,
    whereby said thin layer of electrically conductive material in said holes determines local current density of a current conducted through said holes between said first lines to said second lines.

2. The method of claim 1 wherein said resistivities of said first and second lines are less than 8 $\mu\Omega$-cm.

3. The method of claim 2 wherein said first and second lines are composed of metallic material selected from the group consisting of aluminum and gold.

4. The method of claim 1 wherein said first and second lines are formed to both a width and thickness of at most 1.0 $\mu$m.

5. The method of claim 1 wherein said thin layer is deposited over said layer of insulative material.

6. The method of claim 1 wherein said thin layer is composed of electrically resistive metallic material selected from the group consisting of lead, and alloys containing at least two of nickel, chromium, iron, copper, manganese, tungsten and silicides of these.

7. The method of claim 1 wherein said holes are formed in said layer of insulative material by applying a resist layer to said layer of insulative material, patterning hole areas in said resist with a mask, removing said hole areas, and etching said layer of insulative material where said hole areas of said resist have been removed.

8. The method of claim 1 wherein holes formed in said layer of insulative material have a diameter of at most 1.0 $\mu$m.

9. A method of forming via connections in integrated circuit wafers comprising,
    forming a first metal layer of first electrically conductive lines connected to individual circuit elements on a patterned semiconductor wafer having a first insulative layer thereover, said first lines characterized by a line resistivity,
    applying a second layer of insulative material over said first metal layer,
    patterning a plurality of via holes in said second insulative layer, said via holes being located above and exposing selected portions of said first lines,
    applying a thin layer of electrically resistive material over said layer of insulative material, said thin layer extending into and lining the bottom of said via holes and contacting said exposed selected portions of said first lines, the thin layer characterized by a resistivity in a range from about 10 to about 50 times said line resistivity and a thinness in a range of between 50 nanometers and 100 nanometers, and
    forming a second metal layer of second electrically conductive lines, said second lines extending into said holes into contact with said thin layer, said second lines characterized by a resistivity approximately equal to said line resistivity of said first lines, whereby said thin layer acts to control peak current density about said via holes when current is conducted within an integrated circuit wafer.

10. The method of claim 9 wherein said resistivities of said first and second lines are less than 8 $\mu\Omega$-cm.

11. The method of claim 10 wherein said first and second lines are composed of metal selected from the group consisting of aluminum and gold.

12. The method of claim 9 wherein said thin layer is composed of material selected from the group consisting of lead, and alloys containing a total of at least 75% of at least two of the metals nickel, chromium, iron, copper, and manganese, tungsten and silicides of these.

* * * * *